(12) United States Patent
Adler et al.

(10) Patent No.: US 9,536,767 B1
(45) Date of Patent: Jan. 3, 2017

(54) MATERIAL HANDLING METHOD

(71) Applicant: SAP SE, Walldorf (DE)

(72) Inventors: Tobias Adler, Viernheim (DE); Oliver Radmann, Huffenhardt (DE)

(73) Assignee: SAP SE, Walldorf (DE)

( * ) Notice: Subject to any disclaimer, the term of this patent is extended or adjusted under 35 U.S.C. 154(b) by 0 days.

(21) Appl. No.: 15/258,346

(22) Filed: Sep. 7, 2016

Related U.S. Application Data

(63) Continuation of application No. 14/512,478, filed on Oct. 13, 2014.

(51) Int. Cl.
    *G06F 7/00* (2006.01)
    *H01L 21/68* (2006.01)
    *H01L 21/67* (2006.01)

(52) U.S. Cl.
    CPC ....... *H01L 21/681* (2013.01); *H01L 21/67259* (2013.01)

(58) Field of Classification Search
    USPC .......................................................... 700/218
    See application file for complete search history.

(56) References Cited

U.S. PATENT DOCUMENTS

| | | | | |
|---|---|---|---|---|
| 6,421,579 B1 * | 7/2002 | Dimitri | ............... | G11B 15/689 |
| | | | | 414/273 |
| 8,055,377 B2 * | 11/2011 | Yair | ...................... | G06Q 10/08 |
| | | | | 414/273 |
| 8,220,710 B2 * | 7/2012 | Hoffman | ............... | G06Q 10/087 |
| | | | | 235/375 |
| 8,538,692 B2 * | 9/2013 | Wurman | ............... | G06Q 10/08 |
| | | | | 340/988 |
| 9,008,829 B2 * | 4/2015 | Worsley | ............... | G05D 1/0287 |
| | | | | 700/213 |
| 2007/0210164 A1 * | 9/2007 | Conlon | ................... | G06Q 10/08 |
| | | | | 235/462.01 |
| 2008/0025833 A1 | 1/2008 | Baker et al. | | |
| 2008/0199297 A1 | 8/2008 | Grunbach et al. | | |

(Continued)

*Primary Examiner* — Kyle Logan
(74) *Attorney, Agent, or Firm* — Richardt Patentanwalte PartG m

(57) ABSTRACT

The present disclosure relates to a material handling method of performing by means of an automatic mechanical material handling equipment controlled by a control system at least a first and a second access task for accessing respectively at least a first and at least a second article stored in a material handling storage system, the first and second access tasks having been assigned a first and a second execution priority respectively. The method comprises a) controlling the automatic mechanical material handling equipment to perform the first access task having the highest priority; and in parallel to performing the first access task a1) evaluating data indicative of the material handling storage system for determining that a first intermediate task is to be performed, wherein the first intermediate task is required in order to perform by the automatic mechanical material handling equipment the second access task; and a2) assigning an execution priority to the first intermediate task higher than the second execution priority; b) controlling the automatic mechanical material handling equipment to perform at least the first intermediate task and the second access task according to the order of execution priorities.

20 Claims, 5 Drawing Sheets

(56) References Cited

U.S. PATENT DOCUMENTS

| | | | |
|---|---|---|---|
| 2008/0263555 A1* | 10/2008 | Ventroux | G06F 9/4881 718/103 |
| 2009/0037012 A1* | 2/2009 | Weigang | G05B 19/41865 700/101 |
| 2011/0060449 A1* | 3/2011 | Wurman | G05B 19/4189 700/218 |
| 2011/0295411 A1* | 12/2011 | Rotella | G06Q 10/087 700/216 |
| 2013/0110281 A1 | 5/2013 | Jones et al. | |
| 2013/0245810 A1 | 9/2013 | Sullivan et al. | |

* cited by examiner

MATERIAL HANDLING METHOD

FIELD OF THE DISCLOSURE

This invention relates to automated materials storage systems and methods and more particularly to a material handling method.

DESCRIPTION OF THE RELATED ART

Manufacturing as well as distribution systems and storage management systems have been moving toward material handling automation for years in order to operate with minimal human intervention. However, there is a continuous need to improve materials handling automation namely processes and streamline operations.

SUMMARY OF THE PRESENT DISCLOSURE

Various embodiments provide a material handling method and a control system and an article handling system as described by the subject matter of the independent claims. Advantageous embodiments are described in the dependent claims.

In one aspect, the invention relates to a material handling method of performing by means of an automatic mechanical material handling equipment controlled by a control system at least a first and a second access task for accessing respectively at least a first and at least a second article stored in a material handling storage system, the first and second access tasks having been assigned a first and a second execution priority respectively. The method comprises:
  a) controlling the automatic mechanical material handling equipment to perform the first access task having the highest priority; and in parallel to performing the first access task
    a1) evaluating data indicative of the material handling storage system for determining that a first intermediate task is to be performed, wherein the first intermediate task is required in order to perform by the automatic mechanical material handling equipment the second access task; and
    a2) assigning an execution priority to the first intermediate task higher than the second execution priority;
  b) controlling the automatic mechanical material handling equipment to perform at least the first intermediate task and the second access task according to the order of execution priorities.

In another aspect, the invention relates to a computer program product comprising computer executable instructions to perform the method steps of the preceding method.

In another aspect, the invention relates to a control system for controlling an automatic mechanical material handling equipment to perform at least a first and a second access task for accessing respectively at least a first and at least a second article stored in a material handling storage system, the first and second access tasks having been assigned a first and a second execution priority respectively, the control system being configured for:
  a) controlling the mechanical material handling equipment to perform the first access task having the highest priority; and in parallel to performing the first access task
    a1) evaluating data indicative of the material handling storage system for determining that a first intermediate task is to be performed, wherein the first intermediate task is required in order to perform by the mechanical material handling equipment the second access task; and
    a2) assigning an execution priority to the first intermediate task higher than the second execution priority;
  b) controlling the mechanical material handling equipment to perform at least the first intermediate task and the second access task according to the order of execution priorities.

In another aspect, the invention relates to an article handling system comprising a mechanical material handling equipment and a control system of the previous embodiment.

The mechanical material handling equipment comprises a programmable logic controller. In some embodiments a method of controlling picking operations of at least a first and a second handling unit located in a warehouse by means of an automated picking equipment controlled by a control system, the control system comprising a first and second warehouse order for moving the first and second handling units respectively, the first and second warehouse orders having been assigned a first and a second execution priority respectively. The method comprises the steps performed by the control system of: determining the first warehouse order for moving the first handling unit as the warehouse order having the highest priority; controlling the picking equipment to move the first handling unit using the first warehouse order; and in parallel to moving the first handling unit determining that the second warehouse order for moving the second handling unit is the warehouse order having the subsequent highest execution priority, and determining that an intermediate warehouse order is required such that the second warehouse order may be executed; creating the intermediate warehouse order and assigning an execution priority to the intermediate warehouse higher than the second execution priority; controlling the picking equipment to move the second handling unit using the second warehouse order after performing the intermediate warehouse order.

In some embodiments, a method of controlling picking operations of at least a first and a second handling unit located in a warehouse by means of an automated lift truck controlled by a control system, the control system comprising a first and second warehouse order (WO) for picking the first and second handling unit respectively, the first and second warehouse orders having been assigned a first and a second execution priority respectively. The method comprises determining by the control system when a programmable logic controller (PLC) is busy in confirming a previous warehouse order what has to be executed next by the automated lift truck based on the first and second execution priorities; checking by the control system whether the handling unit (HU) of the first and second Hus to be picked may be removed directly; creating an automatic stock transfer WO to be executed next, if HU to be picked is blocked by another HU; executing next WO by the automated lift truck when previous WO is finished.

In some embodiments, a non-transitory computer-readable medium, with instructions stored thereon, which when executed by at least one processor of computing device, cause the computing device to control an automated lift truck to perform at least a first and a second warehouse order for moving at least a first and a second handling unit located in a warehouse respectively, the first and second warehouse orders being assigned a first and a second execution priority respectively. The control comprises determining the first warehouse order for moving the first handling unit as the warehouse order having the highest priority; controlling the automated lift truck to move the first handling unit using the first warehouse order; and in parallel to moving the first handling unit determining that the second warehouse order for moving the second handling unit is the warehouse order having the subsequent highest execution priority; and determining that an intermediate warehouse order is required such that the second warehouse order may be executed; creating the intermediate warehouse order and assigning an execution priority to the intermediate warehouse higher than the second execution priority; controlling the automated lift truck to move the second handling unit using the second warehouse order after performing the intermediate warehouse order.

According to one embodiment, the warehouse comprises at least one pallet rack having at least one front storage bin and one back storage bin in a front-to-back depth of the pallet rack, wherein the second handling unit is stored in the back storage bin and is blocked for movement by a third handling unit stored in the front storage bin, wherein the intermediate warehouse order comprises a stock transfer task of moving the third handling unit.

According to one embodiment, determining of the intermediate warehouse order is performed using data indicative of at least the storage bins and the content of the storage bins of the at least one pallet rack.

According to one embodiment, determining of the intermediate warehouse order comprises determining that the second handling unit is a defect handling unit, wherein the intermediate warehouse order comprises a task of replacing the second handling unit with a respective non-defect handling unit.

According to one embodiment, the first and second handling units are moved to one of a storage bin of the warehouse and an aisle of the warehouse.

BRIEF DESCRIPTION OF THE DRAWINGS

The accompanying drawings illustrate the various embodiments and, together with the description, further serve to explain the principles of the embodiments and to enable one skilled in the pertinent art to make and use the embodiments.

DETAILED DESCRIPTION

Figure 1:
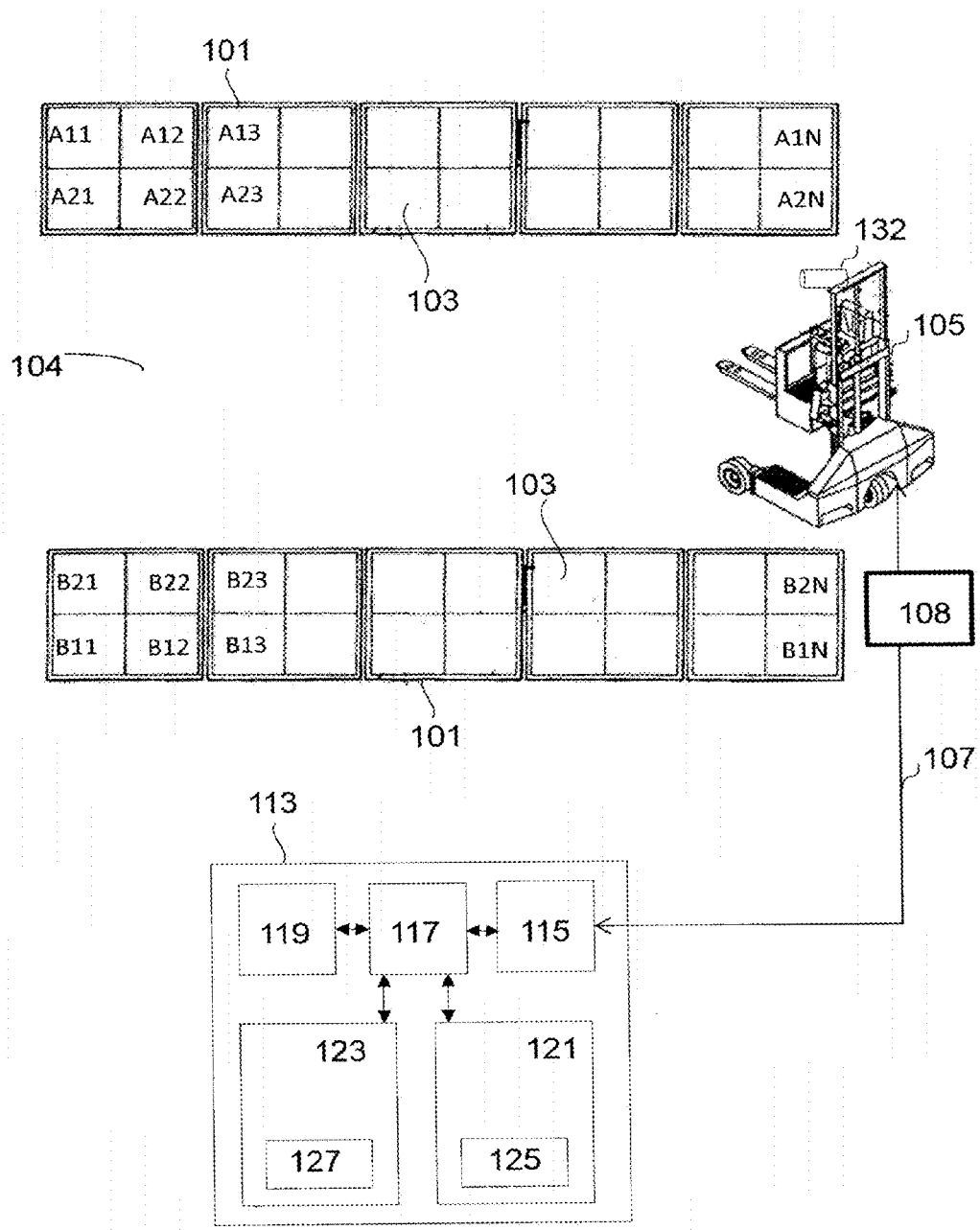
FIG. 1 is a schematic diagram illustrating a storage system.

In the following, like numbered elements in the figures either designate similar elements or designate elements that perform an equivalent function. Elements which have been discussed previously will not necessarily be discussed in later figures if the function is equivalent.

The above features may have the advantage of reducing the idle time of the control system as well as the automatic mechanical material handling equipment. The idle time is the time during which the control system or the automatic mechanical material handling equipment is not used (or inactive).

Another advantage may be that the processing time required for processing the tasks is reduced compared to conventional methods.

Another advantage may be that the present method may be seamlessly integrated in existing control systems since the logic of determining or selecting a task with a highest priority and controlling of the automatic mechanical material handling equipment to perform the task is integrated with the present anticipation method to definition tasks and execution priorities.

The method steps a)-a1)-a2)-b) are executed automatically.

The term "task" or "access task" or "warehouse order" refers to an action to be performed by the automatic mechanical material handling equipment. The task may comprise, for example, an initializing or planning phase and/or an executing phase. The task may be created as a logic program or set of instructions for realizing an intended function. For example, the task may be defined as a telegram that may be sent to a PLC that controls the automatic mechanical material handling equipment to perform the task.

The article may comprise for example a handling unit, a box, a container, a product a material or any storable object or item in the material handling storage system.

The first intermediate task may be a task that has to be performed before the second access to be performed. The first intermediate task may be another access task for accessing another article or any other task related to the mechanical material handling equipment and/or the material handling storage system.

The data indicative of the material handling storage system may be stored in the control system. The data may be updated in a regular basis e.g. when a change is occurred in the material handling storage system or a task is performed in the material handling storage system.

The control system may comprise a smartphone, a PDA, a laptop, a computer system, and the like.

The material handling storage system may comprise a pallet rack to store materials or, cartons or cases or articles on pallets (or "skids"). The material handling storage system may be a multi-depth storage system.

Steps a1)-a2) are performed in parallel to performing the first access task means that steps a1)-a2) started while the first access task is running. Steps a1)-a2) may end before at or after the first access task is performed or ended.

The step b) may be performed in two stages. In the first stage, the first intermediated task is determined or selected as the task having the highest priority among the first intermediate task and the second access task e.g. among non-executed tasks and the automatic mechanical material handling equipment is controlled to perform the first intermediated task. In the second stage, the second access task is determined or selected as the task having the highest priority among the second access task e.g. among non-executed tasks and the automatic mechanical material handling equipment is controlled to perform the second access task.

For example, steps a1)-a2) may be repeated in parallel to every task being executed. For example, in parallel to performing the second access task by the automated or automatic mechanical material handling equipment a potential or eventual intermediate task may be (pre)determined in advance such that the task priorities may be reorganized. In this way, when the task being executed is finished, the next task may be automatically determined without extra delays that may be caused by the post-determination (i.e. after the termination of the second access task being executed) that the intermediate task is to be performed.

The automatic mechanical material handling equipment may comprise an automatic lift truck or any other vehicle or equipment operable to perform access tasks as described herein.

According to one embodiment, a third access task for accessing a third article is assigned a lower execution priority than the second execution priority, wherein the second access task comprises an initialization and an execution phase. The method further comprises in parallel to performing the second access task evaluating the data for determining that a second intermediate task is to be performed before the third access task; determining that the second intermediate task is dependent of the first intermediate task such that the second intermediate task is to be performed after the first intermediate task and before the second access task and assigning an execution priority to the second intermediate task accordingly; in case the second access task is in the initialization phase pausing the mechanical handling equipment; and re-controlling the automatic mechanical material handling equipment to resume and to further perform the second intermediate task, the second and third access tasks according to the order of execution of priorities. For example, in case the second access task is in the execution phase a new task may be created to undo the second access task (e.g. if an article is moved it may be moved back to its original place etc.) and then the second intermediate task, the second and third access tasks may be executed.

This may further reduce the idle time of the control system and the automatic mechanical material handling equipment. Further, this embodiment may have the advantage of providing an accurate execution of the tasks.

According to one embodiment, the method further comprises determining a first idle time of inactivity of the automatic mechanical material handling equipment before performing step b) and after the assigning step; in response to a determination that the first idle time is higher than a maximum idle time threshold delaying execution of step b) until receiving a confirmation of the result of the evaluation.

For example, the result of the evaluation may be presented to a user of the control system and the user may be prompted to provide feedbacks on the result of the evaluation. This embodiment may have the advantage of controlling the workflow of the present method which may increase the accuracy of the tasks execution.

According to one embodiment, the method further comprises determining a second idle time of inactivity of the automatic mechanical material handling equipment as being the idle time of inactivity of the automatic mechanical material handling equipment when performing steps a1)-a2) in series with steps a) and b) instead of parallel execution of steps a1)-a2) to step a), wherein the maximum idle time threshold comprises the second idle time. This may provide a reliable check since the idle time when performing steps a1)-a2) in parallel to step a) may be smaller than the idle time when they are performed in series with other steps.

Parallel execution of steps a1)-a2) to step a) comprises executing a1)-a2) in parallel to performing the first access task by the automatic mechanical material handling equipment.

According to one embodiment, evaluating comprises prompting a user of the control system for a feedback on the second access task using the data; receiving from the user a feedback indicating the first intermediate task.

For example, the data may be presented to the user in the form of a map of the material handling storage system schematically showing the content of the material handling storage system.

The user may comprise, in one example, a computer system or a device that may communicate with the control system.

According to one embodiment, the evaluation is performed using simulation data obtained by a simulation of the second access task based on a model of the mechanical handling equipment, the control system and the material handling storage system, the simulation data being the data.

The simulation of the second access task may be performed on the fly (online) or offline for producing the data that is evaluated.

According to one embodiment, the method further comprises controlling a camera connected to the control system to collect image signals from the material handling storage system, to analyze the collected image signals and to provide the data as a result of the analysis. The method of this embodiment may be regularly performed e.g. on a periodic basis or as soon as a task is performed in the data indicative of the material handling storage system.

According to one embodiment, a task of the first and second access tasks comprises at least one of: moving the respective article from a source storage bin to a destination storage bin in the material handling storage system; replacing the respective article by one or more articles; tagging the respective article. The task may further comprise executing physical inventory counting. The task may further comprise moving the respective article to a drop-off point that may be another storage bin or other locations in the storage system.

According to one embodiment, the second access task comprises moving the second article from a first storage bin to a second storage bin, wherein the evaluating comprises: determining the movement path of the automatic mechanical material handling equipment along which the second article is to be moved to the second storage bin; using the data for determining that at least a third article is stored in a storage bin that it is on the movement path; defining the intermediate task as a task for moving the third article out of the movement path. This may provide a reliable picking system that may increase productivity compared to a streamlining of the task creation and submission by the control system.

According to one embodiment, the third article is given by the first article after the movement of the first article is performed, wherein the first intermediate task comprises recreating the first access task using a different destination storage bin and controlling the automatic mechanical material handling equipment to perform the recreated first access task. In this case, the execution priority of the first intermediate task may be the execution priority of the first access task such that there is no need to assign a new execution priority to the first intermediate task. This may save resources required for determining new priorities.

For example, the first article is moved to a position on the movement path, and thus the third article is determined to be the first article.

According to one embodiment, the evaluating comprises determining that the second article is a defect article, wherein the intermediate task comprises a task of replacing the second article with a respective non-defect article.

According to one embodiment, the evaluating comprises determining that the distance of the automatic mechanical material handling equipment to the second article is higher than a maximum reachable distance for having access to the second article, wherein the intermediate task comprises controlling the automatic mechanical material handling equipment to move close to the second article to form a distance smaller than the maximum reachable distance.

According to one embodiment, the control system is a multiprocessor system, wherein the step of controlling the automatic mechanical material handling equipment to move the first article and the steps of evaluating and assigning are executed by at least two processors of the multiprocessor system.

According to one embodiment, the material handling storage system comprises at least one pallet rack having at least one front storage bin and one back storage bin in a front-to-back depth of the pallet rack, wherein the second article is stored in the back storage bin and is blocked for movement by the third article stored in the front storage bin, wherein the first intermediate task comprises moving the third article.

It is understood that one or more of the aforementioned embodiments may be combined as long as the combined embodiments are not mutually exclusive.

FIG. 1 is a schematic diagram illustrating a storage system 100 e.g. a warehouse. The storage system 100 comprises an automated lift truck (referred to as a lift truck below) or automated guide vehicle 105 that is configured to move in an aisle 104 between material handling storage systems 101 of a storage area of the storage system 100. The lift truck 105 may be guided by a camera e.g. multi-head camera system that uses fixed points of reference to move articles throughout the storage area. In other examples, the lift truck 105 may use lasers, tape, wire or magnets for guidance.

Material handling system 101 may comprise, for example, a pallet rack or any storage structure that may store articles or materials. The material handling storage system 101 may comprise multi-depth storage bins for storing articles $A_{ij}$, $B_{ij}$. For simplification of the description. FIG. 1 shows only two storage depths, the first storage depth comprises articles $A2i$ and the second storage depth comprises articles $A1i$. However, more storage depths may be appreciated.

The storage system 100 may further comprise a programmable logic controller (PLC) 108. The PLC 108 may be part of the lift truck 105 or may not be part of the lift truck 205 e.g. the PLC may be connected to the lift truck 105 via a connection such as a serial link or Ethernet or the like.

The PLC may be a programmable controller, an intelligent relay, a control relay, or another intelligent or microprocessor-based device used for controlling, automating and/or monitoring a data (e.g. industrial) process.

The PLC 108 is connected to a hardware interface 115 of a control system 113 such that for example a communication (e.g. telegram communication) on link or connection 107 may be performed between the control system 113 and the PLC 108 e.g. by a predefined communication protocol. The connection 107 between the hardware interface 115 and the PLC may be a wireline and/or wireless connection. For example, the connection may comprise a serial link, an Ethernet connection, WIFI, Bluetooth or any other connection enabling exchange of data, signals and/or instructions between the PLC and the control system 113.

The control system 113 may comprise a computer, smartphone, PDA, smart TV, smart watch smart glasses a Mobile Data Entry system etc.

The control system 113 uses a processor 117 to control the lift truck 105 via the PLC e.g. controlling the lift truck 105 to perform a task comprises controlling the PLC 108 such that the PLC 108 controls the lift truck 105 to perform the task.

The control system 113 shown in FIG. 1 is representative. Multiple processors and computer systems may be used to represent the functionality illustrated by this single control system 113. The control system 113 comprises the hardware interface 115 which allows the processor 117 to send and receive messages to components of the lift truck 105. The processor 117 is also connected to a user interface 119, computer storage 121, and computer memory 123.

Computer storage 121 is shown as containing data 125 indicative of the material handling storage system 101. For example, the data 125 may indicate the position of each storage bin of the material handling storage system 101 and an indication of the content of each storage bin, the size or dimension of what is stored in each storage bin etc. For example, the data 125 may regularly be updated (e.g. in a periodic basis) or automatically updated as soon as a change is occurred e.g. to the content of the storage bins or to the material handling storage system 101 itself. For example, if a storage bin is emptied, the data may be updated accordingly such that it indicates that that storage bin has nothing stored therein.

The storage system 100 may further comprise a camera 132 that is connected to the control system 113. The camera 132 may be mounted on the lift truck 105 or on any other support system in the storage area such that the camera 132 may collect image signals from the material handling storage system 101. The camera 132 may further be configured to analyze the collected image signals and to provide them in the form of the data 125 as a result of the analysis. This image analysis may be regularly performed in order to update the data 125 as described above. The camera 132 may for example be the multi-head camera to guide the lift truck 105 or may be a separate camera.

The data 125 may be provided by other means as described below.

Program modules 127, may be stored in the computer memory 123. Program modules 127 generally carry out the functions and/or methodologies of embodiments of the invention as described herein.

Figure 2:
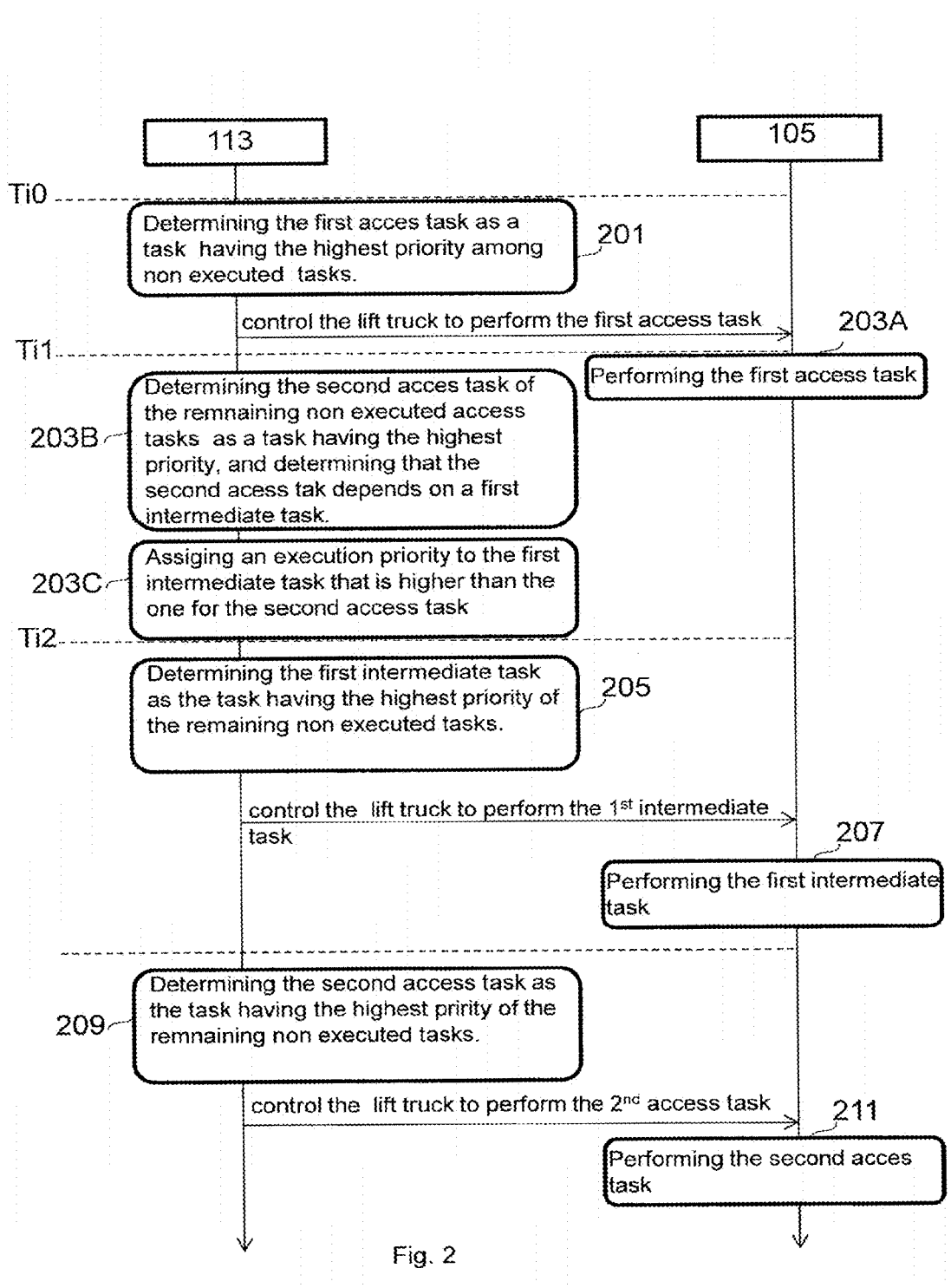
FIG. 2 is a flow diagram illustrating an example material handling method.

FIG. 2 is a flow diagram illustrating an example material handling method in accordance with the present disclosure. For example, an initial list of tasks may comprise a first and a second access task. An access task of the first and second access task may be a task for accessing a respective article $A_{ij}$, $B_{ij}$ of the material handling storage system 101. For example, the access task may comprise moving an article $A_{ij}$ from a given storage bin 103 of the material handling storage system 101 to a drop-off point, tagging an article (e.g. by a timestamp indicating the expiration date unique label to identify and/or provide a quality factor of the article), or counting one or more articles stored in the material handling storage system 101. The drop-off point may for example be another storage bin 103 of the material handling storage system 101.

The initial list of tasks may for example be defined automatically based, for example, on one or more predefined article access rules e.g. an article is to be moved from its storage bin to another storage bin if a certain storage time limit of the article is reached or to change the quality factor associated with the article if the article was stored for a long predefined time period in the same storage bin. The article access rule may comprise, for example, a stock removal rule that uses a LIFO and/or FIFO strategies. In another example, the list of tasks may be received from a user of the control system 113 e.g. in the form of orders or commands. For example, a task of the list of tasks may be tagged as being performed or not performed. The first and second access tasks may be assigned a first and a second execution priority respectively. For example, the first execution priority is higher than the second execution priority.

For simplicity of the description only two access tasks are described; however the skilled person in the art would appreciate that more than two tasks may be used.

In block 201, at time Ti0, the control system 113 may determine or identify one of the first and second access tasks having the highest priority and may control the lift truck 105 to perform the first access task in block 203A. The control of the lift truck 105 may comprise sending a control signal to the PLC that in turns translates the received control signal into commands (such as switching on or off certain elements of the lift truck 105) to be executed by the lift truck 105.

Figure 4:
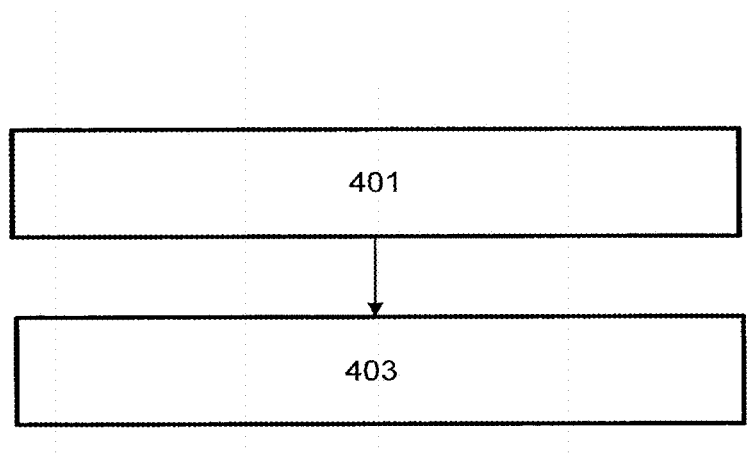
FIG. 4 is a flowchart of an exemplary method for evaluating data indicative of the automatic material handling equipment.
Figure 5:
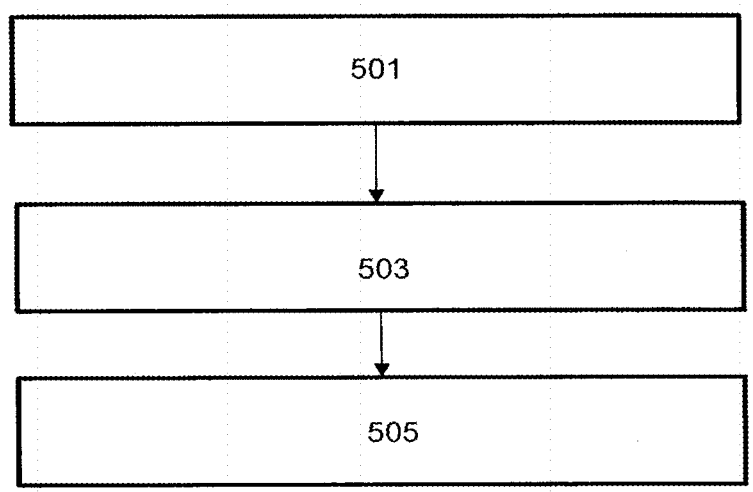
FIG. 5 is a flowchart of another exemplary method for evaluating data indicative of the automatic material handling equipment.

The lift truck 105 may start at time Ti1 to perform the first access task to the respective first article. In parallel to performing the first access task, the control system 113 may determine the subsequent access task having the subsequent execution priority to be performed (block 203B), which is, in this case, the second access task. And, the control system 113 may evaluate (block 203B) the data 125 for determining that a first intermediate task is to be performed before the second access task is performed. In other terms, the second access task depends on the first intermediate task. FIGS. 4-5 provide different example methods for the evaluation of the data 125 for identifying intermediate tasks.

The control system 113 may thus assign (block 203C) an execution priority to the first intermediate task higher than the second execution priority. The execution of blocks 203B and 203C may last more or less than the time required to perform the first access task.

For example, after the first access task is performed, the control system 113 may receive at time Ti2 a confirmation from the PLC to indicate that the first access task is performed. In another example, the control system 113 may detect at time Ti2 automatically that the first access task is performed e.g. using a motion detector that detects the movement of the lift truck 105. For example, if the lift truck 105 does not perform any movement this may be an indication that the first access task is performed or finished. In another example, the control system 113 may have an estimated maximum time (e.g. based on empirical data) that is required for performing the first access task by the lift truck 105. The expiration of the estimated maximum time may be an indication that the first access task is performed.

At or after time Ti2, the control system 113 may determine (block 205) that the first intermediate task has the highest priority among remaining access tasks in the list of tasks (i.e. the first intermediate access task and the second access task). The control system 113 may then control the lift truck 105 to perform the first intermediate task (block 207).

After determining that the first intermediate task is terminated (e.g. using methods as described above with respect to the first access task) the control system 113 may determine (block 209) that the second access task is the task having the highest priority and may control the lift truck 105 to perform the second access task (block 211).

The principle of determining in advance whether there is a dependent task or not may be done in parallel to every running task by the lift truck 105. For example, if the list of tasks comprises access tasks A1, A2, A3 that have to be performed in that order. When performing the task A1 by the lift truck 105, the control system 113 may determine the next task as A2 and may check whether this task A2 is dependent or not from an intermediated task that has to be performed e.g. before A2. In this case the priorities may be changed such that the intermediate task may have higher priority than A2. Also, in parallel to performing by the lift truck 105 either the second access task A2 (or the intermediate task) the control system 113 may determine the next task as A3 and may check whether this task A3 is dependent or not from an intermediated task and so on.

Figure 3:
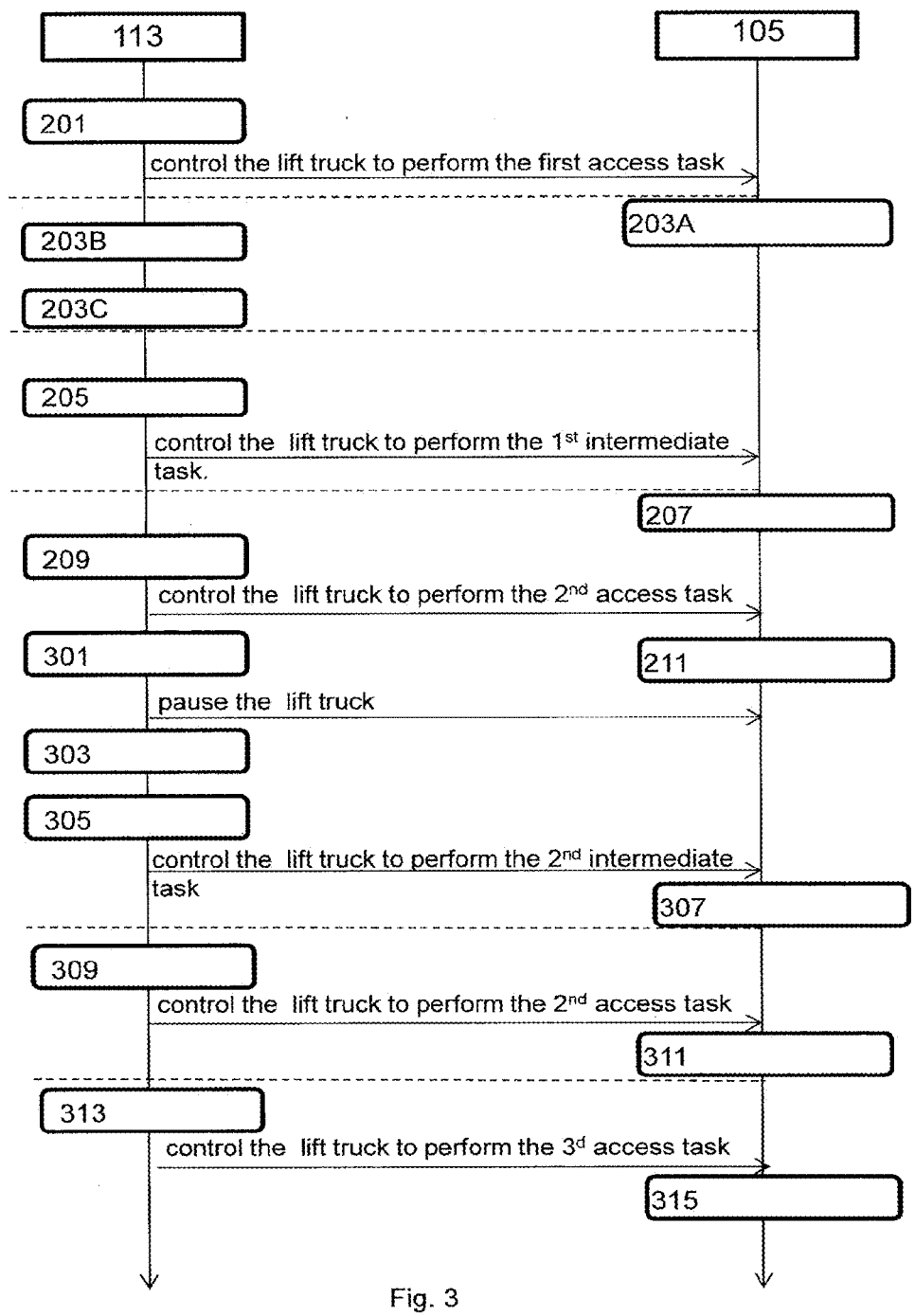
FIG. 3 is a flow diagram illustrating another example material handling method.

FIG. 3 is a flow diagram illustrating another example material handling method in accordance with the present disclosure, wherein the initial list of tasks may further comprise a third access task for accessing a third article. The third access is assigned a lower execution priority than the second execution priority.

The second access task may for example comprise an initialization and an execution phase. In case the second access task comprises moving the second article from its storage bin, the initialization phase may be the phase during which the lift truck 105 moves toward the second article and the execution phase may be the phase during which the lift truck 105 may move the second article.

In parallel to performing the second access task (block 211 of FIG. 2), the control system 113 may evaluate (block 301) the data 125 for determining that a second intermediate task is to be performed before the third access task; and that the second intermediate task is dependent of the first intermediate task such that the second intermediate task is to be performed after the first intermediate task and before the second access task.

Further, the control system 113 may determine (block 301) that the second access task is in the initialization phase (e.g. not effectively executed) and may immediately pause (or interrupt execution of) the lift truck 105 such that the control system 113 may reorganize the tasks in the right orders as follows.

The control system 113 may assign (in block 303) an execution priority to the second intermediate task that is higher than the second execution priority. This step of assigning an execution priority to the second intermediate task may alternatively be performed before the lift truck 105 is paused.

Next, the control system 113 may determine (block 305) that the second intermediate task is the task having the highest priority and may control the lift truck 105 to perform the second intermediated task (block 307).

Upon determining that the second intermediate task is terminated, the control system 113 may determine (block 309) that the second access task is the task having the highest priority and may control the lift truck 105 to perform the second access task (block 311).

Upon determining that the second access task is terminated, the control system 113 may determine (block 313) that the third access task is the task having the highest priority and may control the lift truck 105 to perform the third access task (block 315).

FIG. 4 is a flowchart of an exemplary method for evaluating the data 125.

In step 401, the control system 113 may prompt a user of the control system 113 for a feedback on the second access task using the data 125. For example, the control system may display on a display of the control system a map of the storage bins, their contents and an indication of the second access task e.g. a line indicating the movement path of the second article.

In step 403, the control system 113 may receive from the user a feedback indicating the first intermediate task.

Hg. 5 is a flowchart of an exemplary method for evaluating the data 125 e.g. as performed in block 203B. For example, the second access task comprises moving the second article e.g. A11 from a first storage bin where it is stored to a second storage bin e.g. an empty storage bin of the material handling storage systems 101.

In step 501, the control system 113 may determine the movement path along which the second article A11 is to be moved to the second storage bin e.g. using the data 125 that indicates the position of each storage bins including the second storage bin.

In step 503, the control system 113 may use the data 125 for determining that at least a third article A21 is stored in a storage bin that it is on the movement path i.e. A21 is blocking the movement of A11.

In step 505, the control system 113 may define the intermediate task as a task for moving the third article A21 out of the movement path e.g. to another storage bin.

Figure 6:
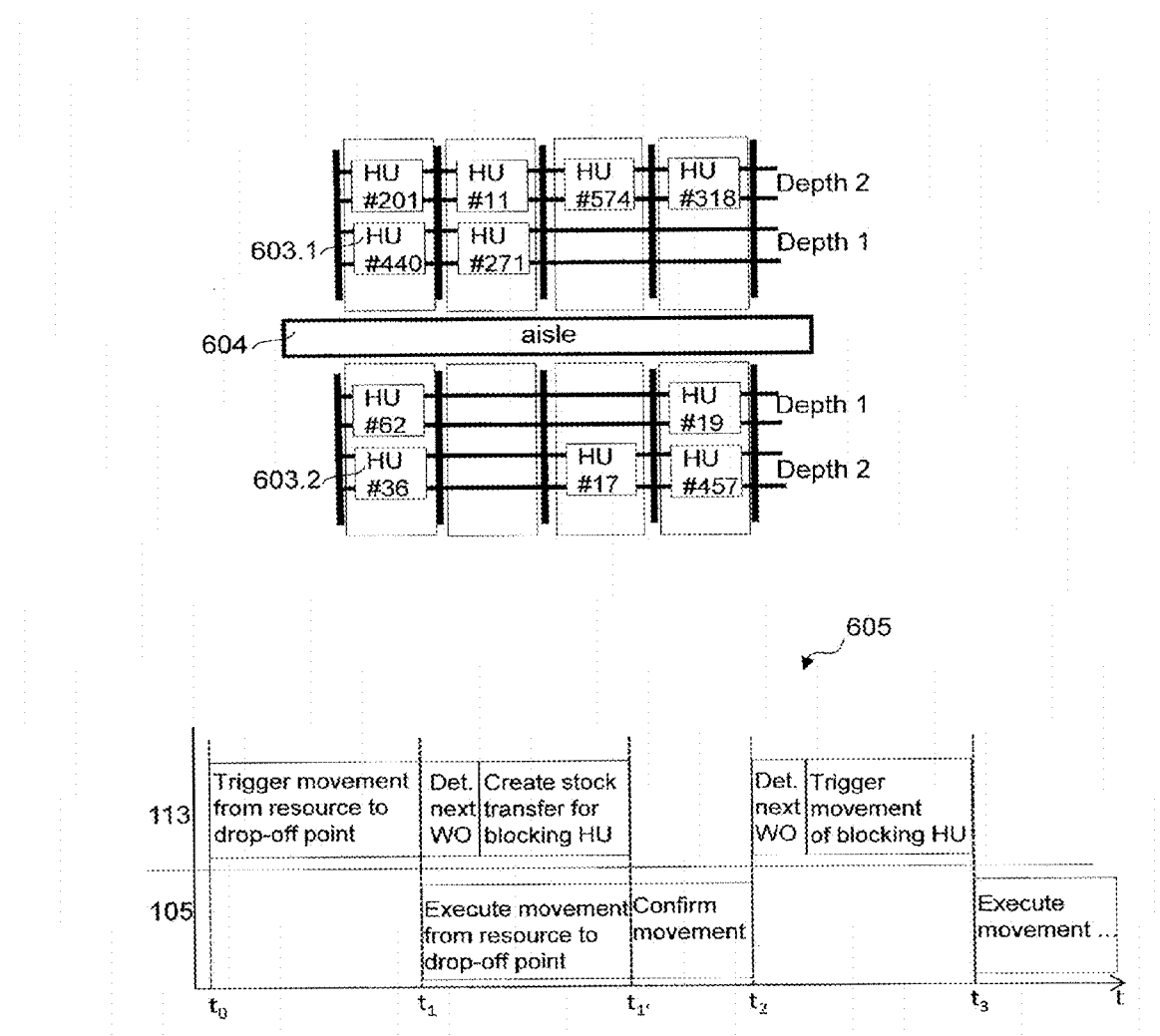
FIG. 6 illustrates a method for picking handling units from a multi-depth storage bins.

FIG. 6 illustrates a method for picking handling units from a multi-depth storage bins.

The lift truck 105 may operate in an aisle 604 e.g. such as 104 of FIG. 1. The lift truck 105 may be configured to pick handling units (HUs) that are not blocked by other HUs. In the example of FIG. 6, the lift truck 105 may directly pick HU 440 from storage bin 603.1. For this HU 440 no other HU is in front. However, HU 36 on storage bin 603.2 cannot be picked directly. Here, HU 62 is blocking HU 36.

In such a case, the control system 113 may automatically detect that HU 62 is blocking HU 36. Therefore, a stock transfer for HU 62 (the stock transfer is an example of the first or second intermediate tasks described above) has to be created prior to picking HU 36. After a task for the stock transfer for HU 62 has been created it has to be executed by the lift truck 105. FIG. 6 also shows the execution flow 605:

In order to reduce the idle time of the lift truck 105 when picking the HU 62, the present method may separate the stock transfer task determination from its execution from a time perspective. Instead of determining the need of stock transfer just before task execution (i.e. stock removal) the control system 113 may "anticipate" the need of future stock transfers earlier.

In this case, the anticipation means that after the execution of the last step of a previous task, additional actions shall be triggered. The last step of the previous task may be for example moving HU 440 from a given storage bin to a destination storage bin. This last step is also triggered by the control system 113. The control system 113 may control the PLC (i.e. to control the lift truck 105) to move HU 440 from a source to a destination storage bin. Next, the lift truck 105 executes this task. In this case, the control system 113 may not send new tasks to the lift truck 105 until the PLC confirms the previous task (i.e. that the previous task is finished). In other words, after sending the task (at time t1) to move the HU 440 from the source to the destination storage bin, the processing in the control system 113 is not time critical because the lift truck 105 does not wait for a task from the control system 113. Instead the lift truck 105 is busy at this point in time (i.e. between t1 and t1') by performing the previous task.

In this period (between t1 and t1') of time the control system 113 may check what has to be executed next by the lift truck 105 based on execution priorities. If the next task is also a stock removal e.g. moving or picking HU 36, the control system 113 checks at this point in time whether the HU 36 to be picked can be removed directly e.g. using data indicative of the storage bins such as data 125. If it is blocked by another HU e.g. HU 62, an automatic stock transfer (i.e. an intermediate task) is needed. In this case, a task for the stock transfer of HU 62 is created between t1 and t1'. So, the creation of the stock transfer task is not time critical. Later on, when the lift truck 105 finished the previous task e.g. at t2 the next task is determined. Due to the prior creation of an automated stock transfer task its task is found now with higher priority. The stock transfer task does not have to be created at this time critical moment e.g. at t2; instead, it was created before and can be sent directly to the lift truck 105. Accordingly, time is saved and the lift truck has less idle times. Finally, this increases the performance of the storage system.

With the present method the additional time needed by the creation of the stock transfer task may be saved. In diagram 605 it can be seen that between t1 and t2 already the determination of the next task and the creation of a stock transfer task takes place. This means that the same decision is taken and even potential user logic would be executed, too. By starting the stock transfer task creation already at t1 idle time of the control system 113 and the lift truck 105 is reduced. In the time frame from t1 to t1' the control system determines the next task and creates a stock transfer task. Additionally, the idle time of the lift truck 105 between t2 and t3 is reduced because fewer actions have to be executed.

The invention claimed is:

1. A material handling method of performing by an automatic mechanical material handling equipment controlled by a control system at least a first and a second access task for accessing respectively at least a first and at least a second article stored in a material handling storage system, the first and second access tasks having been assigned a first and a second execution priority respectively, the method comprising:

a) controlling the automatic mechanical material handling equipment to perform the first access task having the highest priority; and in parallel to performing the first access task;

a1) evaluating data indicative of the material handling storage system for determining that a first intermediate task is to be performed, wherein the first intermediate task is required in order to perform by the automatic mechanical material handling equipment the second access task; and a2) assigning an execution priority to the first intermediate task higher than the second execution priority; and b) controlling the automatic mechanical material handling equipment to perform at least the first intermediate task and the second access task according to the order of execution priorities, wherein the second access task comprises moving the second article from a first storage bin to a second storage bin, wherein the evaluating comprises:

determining the movement path of the automatic mechanical material handling equipment along which the second article is to be moved to the second storage bin;

using the data for determining that at least a third article is stored in a storage bin that it is on the movement path; and defining the first intermediate task as a task for moving the third article out of the movement path.

2. The method of claim 1, wherein a third access task for accessing a third article is assigned a lower execution priority than the second execution priority, wherein the second access task comprises an initialization and an execution phase, the method further comprising:

in parallel to performing the second access task evaluating the data for determining that a second intermediate task is to be performed before the third access task;

determining that the second intermediate task is dependent of the first intermediate task such that the second intermediate task is to be performed after the first intermediate task and before the second access task and assigning an execution priority to the second intermediate task accordingly;

in case the second access task is in the initialization phase pausing the automatic mechanical handling equipment; and re-controlling the automatic mechanical material handling equipment to resume and to further perform the second intermediate task, the second and third access tasks according to the order of execution of priorities.

3. The method of claim 1, wherein evaluating comprises prompting a user of the control system for a feedback on the second access task using the data; and receiving from the user a feedback indicating the first intermediate task.

4. The method of claim 1, wherein the evaluation is performed using simulation data obtained by a simulation of the second access task based on a model of the automatic mechanical handling equipment, the control system and the automatic material handling storage system, the simulation data being the data.

5. The method of claim 1, further comprising:
controlling a camera connected to the control system to collect image signals from the material handling storage system, to analyze the collected image signals and to provide the data as a result of the analysis.

6. The method of claim 1, wherein a task of the first and second access tasks comprises at least one of:
moving the respective article from a source storage bin to a destination storage bin in the material handling storage system;
replacing the respective article by one or more articles; and
tagging the respective article.

7. The method of claim 1, wherein the third article is given by the first article after the movement of the first article is performed, wherein the first intermediate task comprises recreating the first access task using a different destination storage bin for the first article and controlling the automatic mechanical material handling equipment to perform the recreated first access task.

8. The method of claim 1, wherein the evaluating comprises determining that the second article is a defect article, wherein the first intermediate task comprises a task of replacing the second article with a respective non-defect article.

9. The method of claim 1, wherein the evaluating comprises determining that the distance of the automatic mechanical material handling equipment to the second article is higher than a maximum reachable distance for having access to the second article, wherein the first intermediate task comprises controlling the automatic mechanical material handling equipment to move close to the second article to form a distance to the second article smaller than the maximum reachable distance.

10. The method of claim 1, wherein the control system is a multiprocessor system, wherein controlling the automatic mechanical material handling equipment to move the first article and evaluating and assigning are executed by at least two processors of the multiprocessor system.

11. The method of claim 1, wherein the material handling storage system comprises at least one pallet rack having at least one front storage bin and one back storage bin in a front-to-back depth of the pallet rack, wherein the second article is stored in the back storage bin and is blocked for movement by the third article stored in the front storage bin, wherein the first intermediate task comprises moving the third article.

12. The method of claim 1, further comprising:
determining a first idle time of inactivity of the automatic mechanical material handling equipment before performing b) and after the assigning; and
in response to a determination that the first idle time is higher than a maximum idle time threshold delaying execution of b) until receiving a confirmation of the result of the evaluation.

13. The method of claim 12, further comprising determining a second idle time of inactivity of the automatic mechanical material handling equipment as being the idle time of inactivity of the automatic mechanical material handling equipment when performing a1)-a2) in series with a) and b) instead of parallel execution of a1)-a2) to a), wherein the maximum idle time threshold comprises the second idle time.

14. A non-transitory computer-readable medium, with instructions stored thereon, which when executed by at least one processor of a computing device, cause the computing device to control an automated lift truck to perform at least a first and a second warehouse order for moving at least a first and a second handling unit located in a warehouse respectively, the first and second warehouse orders being assigned a first and a second execution priority respectively, the control comprising:
a) controlling the automatic mechanical material handling equipment to perform the first warehouse order having the highest priority; and in parallel to performing the first warehouse order;
a1) evaluating data indicative of the material handling storage system for determining that a first intermediate warehouse order is to be performed, wherein the first intermediate warehouse order is required in order to perform by the automatic mechanical material handling equipment the second access task; and
a2) assigning an execution priority to the first intermediate warehouse order higher than the second execution priority;
b) determining a first idle time of inactivity of the automatic mechanical material handling equipment; and
c) controlling the automatic mechanical material handling equipment to perform at least the first intermediate warehouse order and the second access warehouse order according to the order of execution priorities,
wherein, responsive to a determination that the first idle time is higher than a maximum idle time threshold, execution of b) is delayed until a confirmation of the result of the evaluation is received.

15. The non-transitory computer-readable medium of claim 14, wherein determining of the intermediate warehouse order comprises determining that the second handling unit is a defect handling unit, wherein the intermediate warehouse order comprises a task of replacing the second handling unit with a respective non-defect handling unit.

16. The non-transitory computer-readable medium of claim 14, wherein the warehouse comprises at least one pallet rack having at least one front storage bin and one back storage bin in a front-to-back depth of the pallet rack, wherein the second handling unit is stored in the back storage bin and is blocked for movement by a third handling unit stored in the front storage bin, wherein the intermediate warehouse order comprises a stock transfer task of moving the third handling unit.

17. The non-transitory computer-readable medium of claim 16, wherein determining of the intermediate warehouse order is performed using data indicative of at least the storage bins and the content of the storage bins of the at least one pallet rack.

18. The non-transitory computer-readable medium of claim 16, wherein the first and second handling units are moved to one of a storage bin of the warehouse and an aisle of the warehouse.

19. A control system for controlling an automatic mechanical material handling equipment to perform at least a first and a second access task for accessing respectively at least a first and at least a second article stored in a material handling storage system, the first and second access tasks having been assigned a first and a second execution priority respectively, the control system comprising:
  a hardware processor;
  a memory accessible by the hardware with instructions stored thereon; and
  a hardware interface for allowing the hardware processor to send messages to and receive messages from one or more components of the automatic mechanical material handling equipment;
wherein, the instructions, when executed by the hardware processor, cause the control system to perform a method comprising:
  a) controlling the automatic mechanical material handling equipment to perform the first access task having the highest priority; and in parallel to performing the first access task
    a1) evaluating data indicative of the material handling storage system for determining that a first intermediate task is to be performed, wherein the first intermediate task is required in order to perform by the mechanical material handling equipment the second access task; and
    a2) assigning an execution priority to the first intermediate task higher than the second execution priority;
  b) controlling the automatic mechanical material handling equipment to perform at least the first intermediate task and the second access task according to the order of execution priorities,
wherein the second access task comprises moving the second article from a first storage bin to a second storage bin, and wherein the evaluating comprises:
  determining the movement path of the automatic mechanical material handling equipment along which the second article is to be moved to the second storage bin;
  using the data for determining that at least a third article is stored in a storage bin that it is on the movement path; and
  defining the first intermediate task as a task for moving the third article out of the movement path.

20. The control system of claim 19, wherein the method further comprises:
  determining a first idle time of inactivity of the automatic mechanical material handling equipment before performing b) and after the assigning; and
  in response to a determination that the first idle time is higher than a maximum idle time threshold delaying execution of b) until receiving a confirmation of the result of the evaluation.

* * * * *